(12) United States Patent
Qiu (10) Patent No.: US 10,292,433 B2
(45) Date of Patent: May 21, 2019

(54) ATOMIZER AND AEROSOL GENERATING DEVICE USING SAME

(71) Applicant: CHANGZHOU JWEI INTELLIGENT TECHNOLOGY CO., LTD., Changzhou (CN)

(72) Inventor: Wei-Hua Qiu, Changzhou (CN)

(73) Assignee: CHANGZHOU JWEI INTELLIGENT TECHNOLOGY CO., LTD., Changzhou (CN)

( * ) Notice: Subject to any disclaimer, the term of this patent is extended or adjusted under 35 U.S.C. 154(b) by 0 days.

(21) Appl. No.: 15/717,957

(22) Filed: Sep. 28, 2017

(65) Prior Publication Data

US 2018/0014577 A1    Jan. 18, 2018

Related U.S. Application Data

(63) Continuation of application No. PCT/CN2016/086293, filed on Jun. 17, 2016.

(30) Foreign Application Priority Data

Jun. 19, 2015    (CN) .................. 2015 2 04300630 U (51) Int. Cl.
*A24F 47/00* (2006.01)
*B05B 11/06* (2006.01)

(52) U.S. Cl.
CPC ............ *A24F 47/008* (2013.01); *A24F 47/00* (2013.01); *B05B 11/06* (2013.01)

(58) Field of Classification Search
CPC ....... A24F 47/008; A24F 47/002; B05B 11/06
See application file for complete search history.

(56) References Cited

U.S. PATENT DOCUMENTS

| 3,561,444 A | * | 2/1971 | Boucher ........... A61M 15/0085 |
| | | | 128/200.16 |
| 2016/0158788 A1 | * | 6/2016 | Orita ................... B05B 17/0615 |
| | | | 239/102.1 |

(Continued)

FOREIGN PATENT DOCUMENTS

| CN | 104207330 | * | 8/2014 |
| CN | 104207330 A | | 12/2014 |

(Continued)

*Primary Examiner* — Darren W Gorman
*Assistant Examiner* — Qingzhang Zhou
(74) *Attorney, Agent, or Firm* — ScienBiziP, P.C.

(57) ABSTRACT

One atomizer for an artificial cigarette includes an atomizing assembly and an adjustment assembly thereon. The atomizing assembly includes an accommodation cavity and the adjustment assembly includes a substrate and an adjustment member rotatably disposed on the substrate. A liquid inlet port is defined in the substrate, the port communicating with the accommodation cavity. The adjustment member adjusts a size of the liquid inlet port exposed during rotation of the adjustment member. A second atomizer includes an atomizing assembly and an air inlet port, the atomizing assembly includes an atomizing cavity and an air passage. The air passage has one end communicating with a top of the atomizing cavity and another end communicating with the air inlet port. An aerosol generating device including either one of the above atomizers is also provided.

13 Claims, 7 Drawing Sheets

(56) References Cited

U.S. PATENT DOCUMENTS

2016/0249683 A1\* 9/2016 Li .................... A24F 47/008
　　　　　　　　　　　　　　　　　　　　　　　131/329
2017/0347705 A1\* 12/2017 Li .................... A24F 47/008
2017/0359858 A1\* 12/2017 Liu ................... H05B 1/0291

FOREIGN PATENT DOCUMENTS

| CN | 203986125 U | 12/2014 |
| CN | 204032373 U | 12/2014 |
| CN | 204217908 U | 3/2015 |
| CN | 104544575 A | 4/2015 |
| CN | 204306045 U | 5/2015 |
| CN | 205082671 U | 3/2016 |

\* cited by examiner

ATOMIZER AND AEROSOL GENERATING DEVICE USING SAME

FIELD

The subject matter herein generally relates to aerosol generating devices, and particularly, to an atomizer free of leakage and an aerosol generating device using same.

BACKGROUND

Electronic cigarettes in the market are prone to liquid leakage. There are many factors to cause leakage, of which the main factor is that the nicotine liquid easily leaks from storage via the atomizing assembly. The leaked nicotine liquid may be inhaled by users and creates bad user experience. Further, the nicotine liquid may leak out to the batteries or/and to the control panel, which may affect the normal working of the electronic cigarettes.

Electronic cigarettes can be equipped with a leakproof structure to prevent the nicotine liquid from leaking, however, such leakproof structure is generally complicated and has poor reliability.

SUMMARY

An atomizer and an aerosol generating device that can be made leak-proof are provided.

An atomizer is provided, the atomizer includes an atomizing assembly and an adjustment assembly disposed on the atomizing assembly. The atomizing assembly includes an accommodation cavity, the adjustment assembly includes a substrate and an adjustment member rotatably disposed on the substrate, and the substrate is defined with a liquid inlet port communicating with the accommodation cavity. The adjustment member is configured for adjusting a size of the liquid inlet port exposed during rotation of the adjustment member.

According to an embodiment, the adjustment member defines an adjustment window, and the adjustment member covers or exposes the liquid inlet port via the adjustment window during rotation of the adjusting member.

According to an embodiment, the adjustment member defines an adjustment window, and the adjustment member covers or exposes the liquid inlet port via the adjustment window during rotation of the adjusting member.

According to an embodiment, the atomizing assembly includes an air passage and an atomizing cavity communicating with the air passage. The substrate defines an air inlet port communicating with the air passage, the adjustment member can cover or expose the air inlet port via the adjustment window during rotation of the adjustment member.

According to an embodiment, the atomizing assembly further includes an accommodation tube, a connection tube, and a base. The connection tube is received in the accommodation tube. The adjustment assembly is located at one end of the accommodation tube, and the base is located at another opposite end of the accommodation tube, the accommodation tube. The connection tube, the base and the adjustment assembly cooperatively form the accommodation cavity for accommodating aerosol source material.

According to an embodiment, the atomizing assembly further includes an atomizing tube. The atomizing tube is received in the connection tube, and the air passage is formed between the atomizing tube and the connection tube.

Another atomizer is also provided, this atomizer includes atomizing assembly and an air inlet port. The atomizing assembly includes an atomizing cavity and an air passage. The air passage has one end communicating with a top of the atomizing cavity and another end communicating with the air inlet port.

According to an embodiment, the atomizing assembly further includes an accommodation tube, an atomizing tube and a connection tube. The connection tube is received in the accommodation tube. The atomizing tube is received in the connection tube. The air passage is formed between the atomzing tube and the connection tube, and an accommodation cavity is formed between the accommodation tube and the connection tube.

According to an embodiment, the atomizing assembly further includes an adjustment assembly and a base. The atomizing tube has one end mounted on the base and another end mounted on the adjustment assembly. The atomizing tube and the base cooperatively form the atomizing cavity. The atomizing tube defines an opening communicating between the atomizing cavity and the air passage.

According to an embodiment, the atomizing tube includes a tube body and a tube cover connecting with the tube body. One end of the tube body far away from the tube cover is disposed on the base, the tube body and the base cooperatively forming the atomizing cavity, and an end of the tube cover far away from the tube body is disposed on the adjustment assembly. The tube cover is received in the connection tube to form the air passage therebetween, the opening is defined on the tube cover.

According to an embodiment, the adjustment assembly includes a substrate and an adjustment member rotatably disposed on the substrate. The air inlet port is defined on the substrate, the adjustment member covers or exposes the air inlet port during rotation of the adjustment member.

According to an embodiment, the substrate defines a liquid inlet port opposite to the air inlet port, the liquid inlet port communicates with the accommodation cavity. The adjustment member covers or exposes the liquid inlet port during rotation of the adjusting member.

According to an embodiment, the adjustment member is an adjustment ring rotatably sleeved on the substrate. The adjustment ring defines an adjustment window, the adjustment ring covers or exposes the liquid inlet port or the air inlet port via the adjustment window during rotation of the adjusting ring.

According to an embodiment, the adjustment member is an adjustment pad clamped to an edge or an interior of the substrate and rotatable along the edge or interior of the substrate. The adjustment pad covers or exposes the liquid inlet port or the air inlet port during rotation of the adjustment pad.

According to an embodiment, a protruding stop plate is formed on the substrate, and a limiting bulge is formed on the adjustment member corresponding to the protruding stop plate.

An aerosol generating device is provided, the aerosol generating device can include any one of the above atomizers.

The atomizer and the aerosol generating device have the advantages of firstly, the adjustment assembly being integrated with air inlet, liquid inlet and allows adjustment of air inlet volume, which simplifies and shortens the atomizer.

Secondly, the adjustment assembly is located at the top portion of the atomizer close to the suction apparatus, which causes air to enter from the top portion of the atomizer rather than from the bottom portion of an atomizer. The absence of an air inlet port at the bottom portion of the atomizer means that the bottom portion of the atomizer can be sealed to prevent the aerosol source from leaking.

Thirdly, liquid is injected into the atomizer from the top portion of the atomizer, a detachable connection between the atomizing assembly and the bottom cover is thus not required and liquid leakage is thereby avoided.

Fourthly, the atomizer is simple in structure and liquid leakage is prevented without employing a complicated leak-proof structure.

Fifthly, the atomizer allows ingress of both air and liquid at the top portion of the atomizer.

BRIEF DESCRIPTION OF THE DRAWINGS

Implementations of the present technology will now be described, by way of example only, with reference to the attached figures.

DETAILED DESCRIPTION

The present disclosure is made in conjunction with the accompanying drawings. Specific embodiments of the present disclosure are described to further illustrate an atomizer and an aerosol generating device utilizing same.

In the following description, when an element is described as being "fixed to" another element, the element can be fixed to the another element with or without intermediate elements. When an element is described as "connecting" another element, the element can be connected to the another element with or without intermediate elements.

Without given definition, all terms given below are of the same meaning as commonly understood by those skilled in the art. The term "and/or" means including any and all combinations of one or more of associated listed items.

Figure 1:
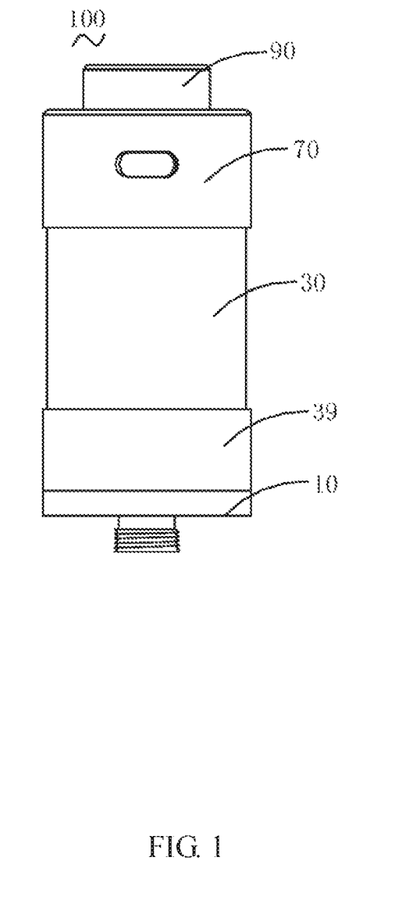
FIG. 1 is a schematic view of an atomizer according to an embodiment.

Referring to FIG. 1, an embodiment of the atomizer 100 includes a bottom cover 10, an atomizing assembly 30, a power assembly 50, and an adjustment assembly 70.

The atomizing assembly 30 is disposed on the bottom cover 10. The power assembly 50 is installed in the atomizing assembly 30. The adjustment assembly 70 is disposed on the atomizing assembly 30 and communicates with the atomizing assembly 30. The adjustment assembly 70 is configured to adjust the air and liquid inlet operations and further adjust the air inlet volume.

Referring further to FIGS. 2-5, the atomizing assembly 30 includes an accommodation tube 31, an atomizing tube 33, a connection tube 35, an accommodation cavity 37, a base 39, an air passage 41, an atomizing cavity 43, a heating component 47, and a liquid conduction component 49. The atomizing tube 33 is received in the connection tube 35. The connection tube 35 is received in the accommodation tube 31. The accommodation tube 31, the connection tube 35, the base 39, and the adjustment assembly 70 cooperatively form the accommodation cavity 37 for accommodating aerosol source material. The air passage 41 is formed between the atomizing tube 33 and the connection tube 35. The liquid conduction component 49 is surrounded by the heating component 47.

Figure 2:
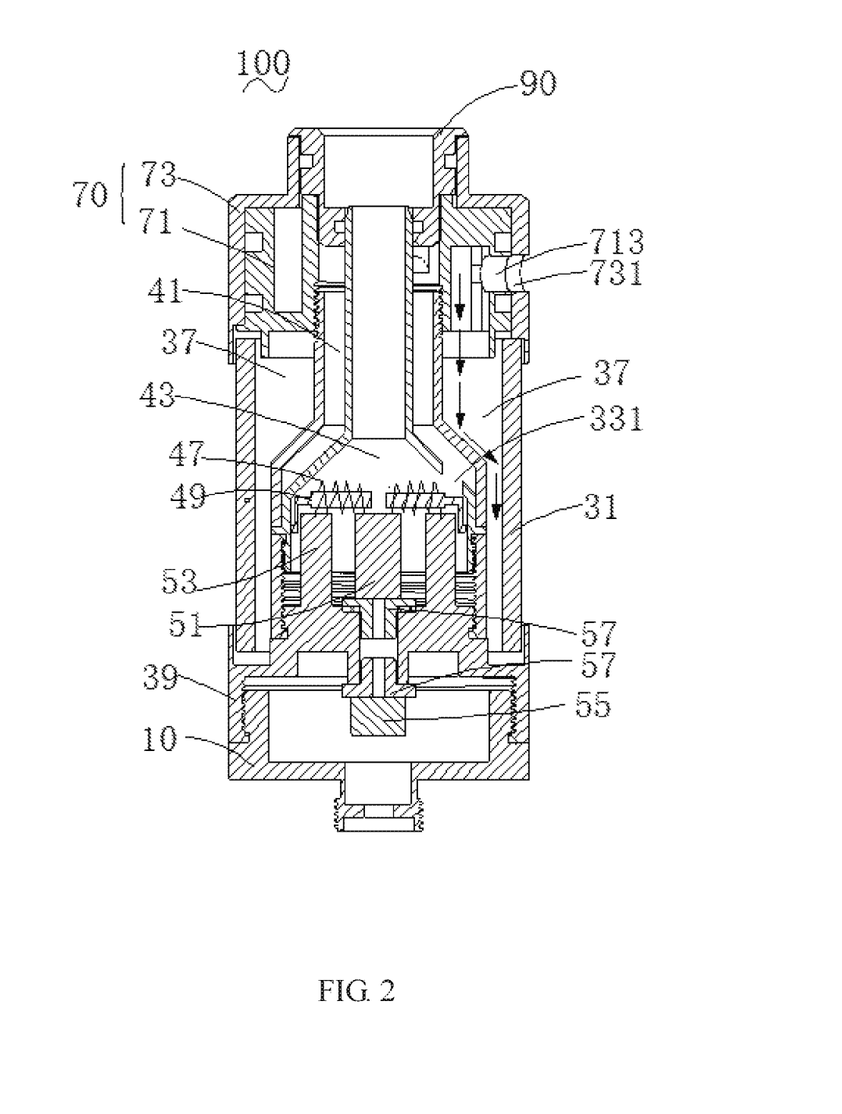
FIG. 2 is a cross-sectional view of the atomizer of FIG. 1.
Figure 3:
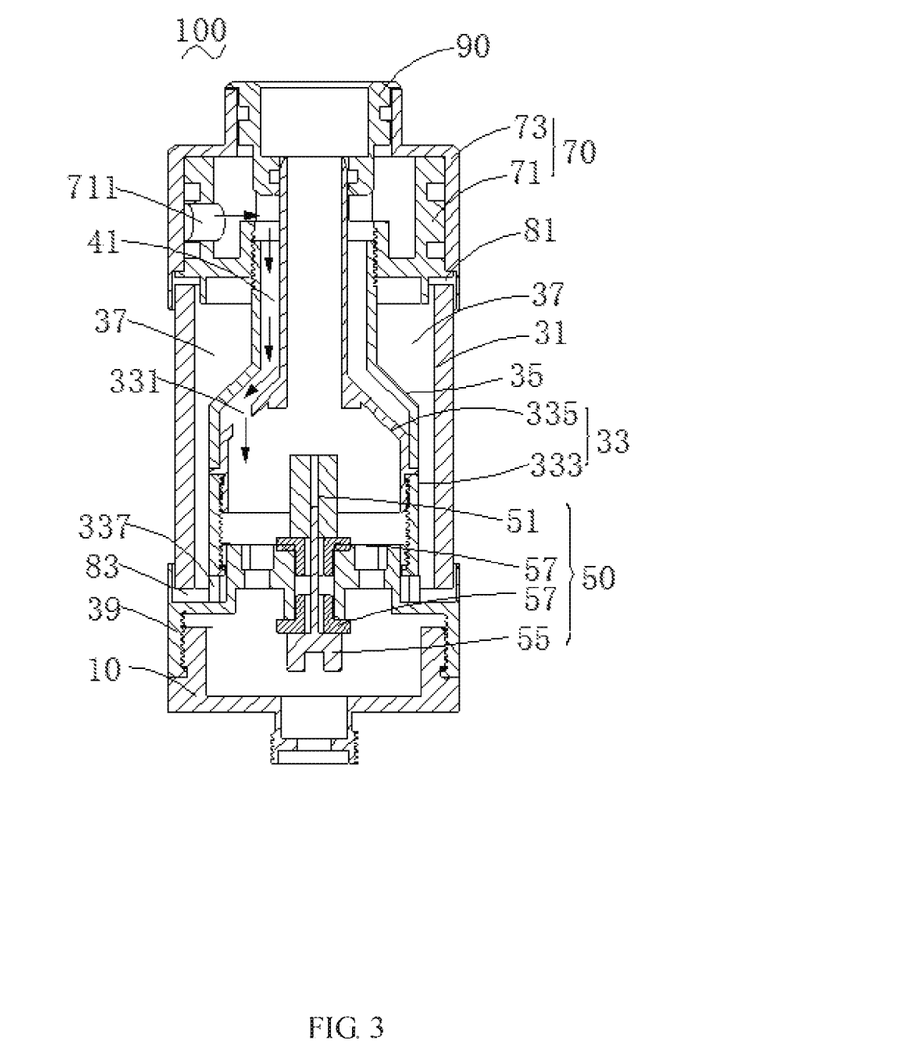
FIG. 3 is a cross-sectional view of the atomizer of FIG. 1 from another angle.
Figure 4:
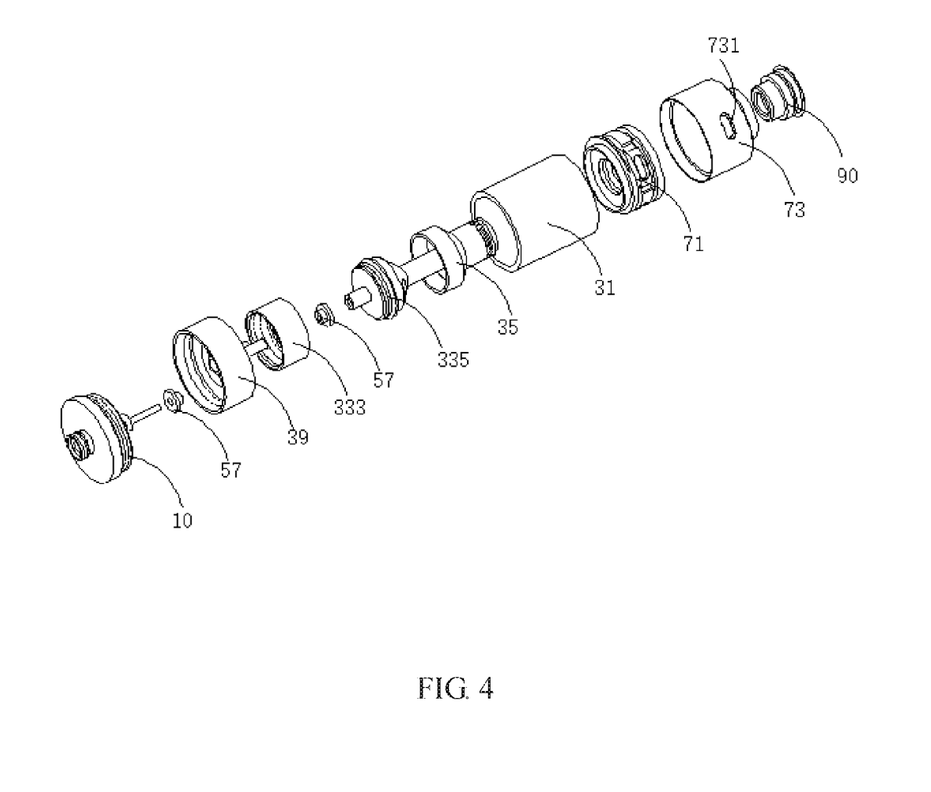
FIG. 4 is an exploded perspective view of the atomizer of FIG. 1.

One end of the accommodation tube 31 is disposed on the base 39, the opposite end thereof resists the adjustment assembly 70.

The atomizing tube 33 is accommodated in the accommodation tube 31, specifically, the atomizing tube 33 is concentrically accommodated in the accommodation tube 31. The atomizing tube 33 has one end mounted on the base 39 and another opposite end mounted on the adjustment assembly 70. The atomizing tube 33 defines an opening 331 which communicates between the atomizing cavity 43 and the air passage 41.

Specifically the atomizing tube 33 includes a tube body 333 and a tube cover 335 connected to the tube body 333. The end of the tube body 333 far away from the tube cover 335 is disposed on the base 39. The end of the tube cover 335 far away from the tube body 333 is disposed on the adjustment assembly 70. The tube cover 335 in the connection tube 35 to form the air passage 41 therebetween. The opening 331 is defined on the tube cover 335. In the embodiment, the tube cover 335 and the tube body 333 are screw connected together.

Gap between the tube body 333 and the base 39 forms a liquid inlet hole 337 for aerosol source material to enter the atomizing cavity 43.

The power assembly 50 includes an anode 51, a cathode 53, an anode contacting element 55, and an insulating element 57. The heating component 47 is electrically connected to the anode 51 at one end and electrically connected to the cathode 53 at another opposite end. The insulating element 57 is sleeved on the anode contacting element 55 to electrically isolate the anode contacting element 55 from the cathode 53. The anode contacting element 55 is electrically connected with the anode 51 and a power source (not shown), to power the atomizing assembly 30.

Figure 5:
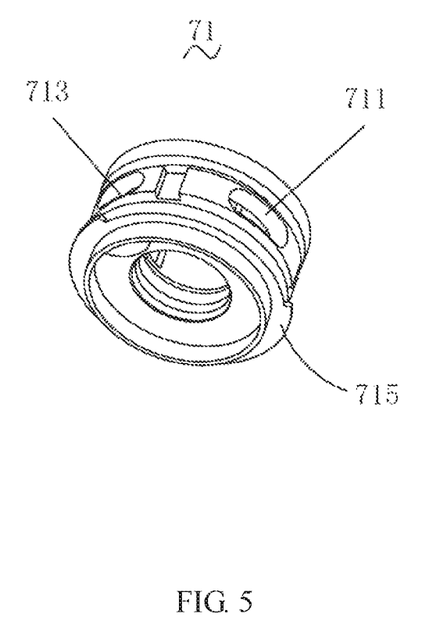
FIG. 5 is a schematic view of a substrate of the atomizer of FIG. 4.
Figure 6:
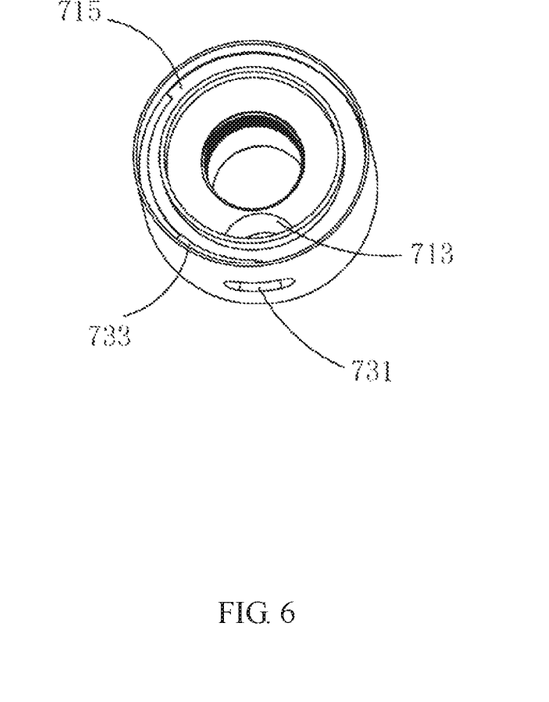
FIG. 6 is a schematic view of the assembly of an adjustment member, a limiting bulge, and a stop plate of the substrate of FIG. 4.
Figure 7:
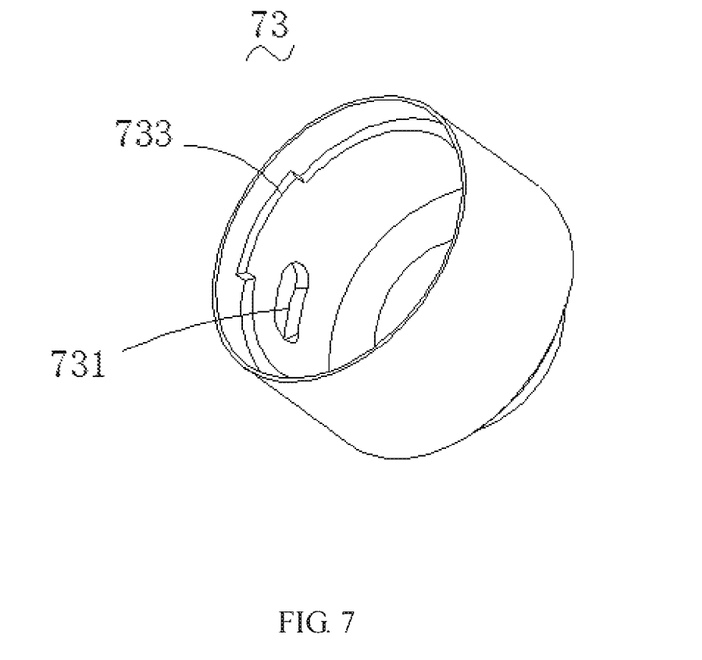
FIG. 7 is a schematic view of the adjustment member of the atomizer of FIG. 4.

The adjustment assembly 70 is configured to adjust the air and liquid inlet operations and further adjust the air inlet volume to the atomizing assembly 30. The adjustment assembly 70 includes a substrate 71 and an adjustment member 73. The adjustment member 73 is rotatably sleeved on the substrate 71, and the movement of adjustment member 73 in the axial direction of the substrate 71 is restricted by the substrate 71. In the embodiment, the adjustment member 73 is an adjustment ring rotatably sleeved on the substrate 71.

The substrate 71 defines an air inlet port 711 communicating with the air passage 41, thus external air can flow through the air inlet port 711 and the air passage 41 to reach the atomizing cavity 43. The adjustment member 73 defines an adjustment window 731 that can communicate with the air inlet port 711.

The effective exposed size of the air inlet port 711 can be adjusted by rotating the adjustment member 73, as the adjustment window 731 rotates with the adjustment member 73. The rotation of the adjustment window 731 can increase or decrease the exposed size of the air inlet port 711. The more the air inlet port 711 is exposed, the larger is the volume of air intaken via the inlet port 711. On the contrary, the less the air inlet port 711 is exposed, the smaller is the volume of air intaken via the air inlet port 711.

It can be appreciated that, the substrate 71 can define two or more than two air inlet ports 711, and the air inlet ports 711 can be the same or different sizes.

It can be appreciated that, the air volume inlet to the atomizer 100 can be adjusted so that only the air inlet port 711 can be wholly or partly exposed by the adjustment window 731. In other embodiments, the numbers, shapes, and sizes of the air inlet ports 711 and the adjustment windows 731 can be varied according to actual needs.

The substrate 71 further defines at least one liquid inlet port 713 opposite to the air inlet port 711. The liquid inlet port 713 communicates with the accommodation cavity 37. The aerosol source material is conducted to the accommodation cavity 37 via the liquid inlet port 713. In the embodiment, the substrate 71 and the connection tube 35 are screw connected together. The liquid inlet port 713 and the air inlet port 711 are aligned at an outer circumference of a cross section of the substrate 71.

In use, the liquid inlet port 713 is completely covered by the adjustment member 73 to prevent liquid from reaching the accommodation cavity 37 via the liquid inlet port 713 when the adjustment window 731 exposes at least part of the air inlet port 711. When the adjustment member 73 is rotated and the adjustment window 731 exposes at least part of the liquid inlet port 713, liquid can flow to the accommodation cavity 37 via the liquid inlet port 713. After the injection is completed, the adjustment member 73 can be rotated so that the adjustment window 731 exposes the air inlet port 711, thus aerosol generating devices employing such an atomizer 100 can provide users with a simulation of drawing on a real cigarette.

In other embodiments, the adjustment member 73 can be an adjustment pad clamped to an edge or an interior of the substrate 71 and rotatable along the edge or interior of the substrate 71. The adjustment pad covers or exposes the liquid inlet port 713 or the air inlet port 711 during the rotation of the adjustment pad.

Furthermore, a protruding stop plate 715 is formed on the substrate 71, and a limiting bulge 733 is formed on the adjustment member 73 corresponding to the stop plate 715. The limiting bulge 733 can only move between two opposite ends of the stop plate 715.

Referring to FIG. 6, a close fitting member (not shown) can be provided between the substrate 71 and the adjustment member 73, so as to enhance the leakproofness of the atomizer 100 as well as to prevent the adjustment member 73 from rotation, randomly or caused by misoperation. As can be understood, with suitable sizes, close fitting relationship can be created between the substrate 71 and the adjustment member 73 even without the close fitting member.

Furthermore, the atomize 100 includes a seal to seal the accommodation cavity 37. In the embodiment, the seal includes a top seal 81 and a bottom 83. The top seal 81 is disposed between the accommodation tube 31 and the substrate 71, while the bottom seal 83 is disposed between the accommodation tube 31 and the base 39.

Furthermore, the atomizer 100 includes a connection member 90 for connecting a suction apparatus and the atomizer 100, thus facilitating the sucking out of vaporized aerosol source material by a user. The connection member 90 has one end connecting with the adjustment member 73 and another end connecting with the atomizing tube 33.

As can be understood, the adjustment member 73 is not limited to only being “rotatably” or “slidably” disposed on the substrate 71, the adjustment member 73 can be “movably” disposed on the substrate 71 according to the actual shape of the atomizer 100. “Slidably” means moving up and down or left and right along the substrate 71.

The present disclosure also provides an aerosol generating device including the atomizer 100.

The atomizer 100 has the advantages of firstly, the adjustment assembly 70 being integrated with air inlet, liquid inlet, and adjustment of air inlet volume, which simplifies and shortens the atomizer 100.

Secondly, the adjustment assembly 70 is located at the top portion of the atomizer 100 close to the suction apparatus, which causes air to enter from the top portion of the atomizer 100 rather than from the bottom portion of an atomizer. The absence of an air inlet port at the bottom portion of the atomizer 100 allows the bottom portion of the atomizer 100 to be sealed to prevent the aerosol source material from leaking.

Thirdly, liquid is injected into the atomizer 100 from the top portion of the atomizer 100, a detachable connector between the atomizing assembly 30 and the bottom cover is thus not required and liquid leakage is avoided.

Fourthly, the atomizer 100 is simple in structure and liquid leakage is prevented without employing a complicated leakproof structure.

Fifthly, the atomizer 100 allows ingress of both air and liquid at the top portion of the atomizer 100.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims.

What is claimed is:

1. An atomizer comprising an atomizing assembly and an adjustment assembly disposed on the atomizing assembly, the atomizing assembly comprising an accommodation cavity for accommodating aerosol source material, the adjustment assembly comprising a substrate and an adjustment member rotatably disposed on the substrate, the substrate defining a liquid inlet port communicating with the accommodation cavity, and an air inlet port opposite to the liquid inlet port, the adjustment member being configured to cover or expose the liquid inlet port or the air inlet port during rotation of the adjustment member; wherein the liquid inlet port and the air inlet port are aligned at an outer circumference of the substrate.

2. The atomizer as claimed in claim 1, wherein, the atomizing assembly further comprises an accommodation tube, an atomizing tube and a connection tube, the connection tube is received in the accommodation tube, the atomizing tube is received in the connection tube, an air passage is formed between the atomizing tube and the connection tube communicating between the air inlet port and an atomizing cavity, the accommodation cavity is formed between the accommodation tube and the connection tube.

3. The atomizer as claimed in claim 2, wherein, the atomizing assembly further comprises a base, the atomizing tube has one end mounted on the base and another end mounted on the adjustment assembly, the atomizing tube and the base cooperatively form the atomizing cavity, the atomizing tube defines an opening communicating between the atomizing cavity and the air passage.

4. The atomizer as claimed in claim 3, wherein the atomizing tube comprises a tube body and a tube cover connecting with the tube body, an end of the tube body away from the tube cover is disposed on the base, the tube body and the base cooperatively form the atomizing cavity, an end of the tube cover away from the tube body is disposed on the adjustment assembly, the tube cover is received in the connection tube to form the air passage therebetween, the opening is defined on the tube cover.

5. The atomizer as claimed in claim 1, wherein, the adjustment member is an adjustment ring rotatably sleeved on the substrate, the adjustment ring defines an adjustment window, the adjustment ring covers or exposes the liquid inlet port or the air inlet port via the adjustment window during rotation of the adjustment ring.

6. The atomizer as claimed in claim 1, wherein, a protruding stop plate is formed on the substrate, and a limiting bulge is formed on the adjustment member corresponding to the protruding stop plate.

7. An aerosol generating device comprising an atomizer, the atomizer comprising an atomizing assembly and an adjustment assembly disposed on the atomizing assembly, the atomizing assembly comprising an accommodation cavity for accommodating aerosol source material, the adjustment assembly comprising a substrate and an adjustment member rotatably disposed on the substrate, the substrate defining a liquid inlet port communicating with the accommodation cavity, and an air inlet port opposite to the liquid inlet port, the adjustment member being configured to cover or expose the liquid inlet port or the air inlet port during rotation of the adjustment member; wherein the liquid inlet port and the air inlet port are aligned at an outer circumference of the substrate.

8. The aerosol generating device as claimed in claim 7, wherein, the atomizing assembly further comprises an accommodation tube, an atomizing tube and a connection tube, the connection tube is received in the accommodation tube, the atomizing tube is received in the connection tube, an air passage is formed between the atomizing tube and the connection tube communicating between the air inlet port and an atomizing cavity, the accommodation cavity is formed between the accommodation tube and the connection tube.

9. The aerosol generating device as claimed in claim 8, wherein, the atomizing assembly further comprises a base, the atomizing tube has one end mounted on the base and another end mounted on the adjustment assembly, the atomizing tube and the base cooperatively form the atomizing cavity, the atomizing tube defines an opening communicating between the atomizing cavity and the air passage.

10. The aerosol generating device as claimed in claim 9, wherein the atomizing tube comprises a tube body and a tube cover connecting with the tube body, an end of the tube body away from the tube cover is disposed on the base, the tube body and the base cooperatively form the atomizing cavity, an end of the tube cover away from the tube body is disposed on the adjustment assembly, the tube cover is received in the connection tube to form the air passage therebetween, the opening is defined on the tube cover.

11. The aerosol generating device as claimed in claim 7, wherein, the adjustment member is an adjustment ring rotatably sleeved on the substrate, the adjustment ring defines an adjustment window, the adjustment ring covers or exposes the liquid inlet port or the air inlet port via the adjustment window during rotation of the adjustment ring.

12. The aerosol generating device as claimed in claim 7, wherein, a protruding stop plate is formed on the substrate, and a limiting bulge is formed on the adjustment member corresponding to the protruding stop plate.

13. The atomizer as claimed in claim 1, wherein, the substrate and the adjustment member are close fitted.

\* \* \* \* \*